United States Patent
Shinoda et al.

(10) Patent No.: US 10,498,527 B2
(45) Date of Patent: Dec. 3, 2019

(54) COMMUNICATION SYSTEM AND TRANSMISSION DEVICE

(71) Applicant: SONY CORPORATION, Tokyo (JP)

(72) Inventors: Ryota Shinoda, Kanagawa (JP); Takashi Masuda, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/099,064

(22) PCT Filed: Apr. 3, 2017

(86) PCT No.: PCT/JP2017/013925
§ 371 (c)(1),
(2) Date: Nov. 5, 2018

(87) PCT Pub. No.: WO2017/199603
PCT Pub. Date: Nov. 23, 2017

(65) Prior Publication Data
US 2019/0199508 A1 Jun. 27, 2019

(30) Foreign Application Priority Data

May 17, 2016 (JP) .................... 2016-098352

(51) Int. Cl.
*H04L 7/04* (2006.01)
*H04L 7/033* (2006.01)
(Continued)

(52) U.S. Cl.
CPC .............. *H04L 7/033* (2013.01); *H03L 7/095* (2013.01); *H03L 7/197* (2013.01); *H03L 7/22* (2013.01);
(Continued)

(58) Field of Classification Search
CPC ..... H04L 2027/0057; H04L 2027/0032; H04L 2027/0067; H03L 7/099; H03L 7/0995; H03L 7/0338
(Continued)

(56) References Cited

U.S. PATENT DOCUMENTS 5,982,836 A * 11/1999 Sakae ................. G11B 20/1403
327/157
6,069,927 A 5/2000 Kikuchi
(Continued)

FOREIGN PATENT DOCUMENTS

CN 101641901 A 2/2010
CN 101919228 A 12/2010
(Continued)

OTHER PUBLICATIONS

International Search Report and Written Opinion of PCT Application No. PCT/JP2017/013925, dated Jun. 20, 2017, 09 pages of ISRWO.

*Primary Examiner* — Khai Tran
(74) *Attorney, Agent, or Firm* — Chip Law Group

(57) ABSTRACT

A communication system according to the present disclosure includes a transmission device and a reception device. The transmission device includes a phase synchronizer, a generator, and a controller. The phase synchronizer generates a first clock signal, and is configured to be able to change a frequency of the first clock signal. The generator generates a transmission signal on the basis of the first clock signal. The controller controls the generator and the phase synchronizer to change the frequency of the first clock signal while generating the transmission signal. The reception device receives the transmission signal.

14 Claims, 8 Drawing Sheets

(51) Int. Cl.
*H03L 7/095* (2006.01)
*H03L 7/197* (2006.01)
*H04L 7/10* (2006.01)
*H03L 7/22* (2006.01)
*H04L 7/00* (2006.01)

(52) U.S. Cl.
CPC .................. *H04L 7/04* (2013.01); *H04L 7/10* (2013.01); *H04L 7/0008* (2013.01)

(58) Field of Classification Search
USPC .......... 375/362, 376; 455/103, 127; 327/156
See application file for complete search history.

(56) References Cited

U.S. PATENT DOCUMENTS

| | | | |
|---|---|---|---|
| 8,126,079 | B1 | 2/2012 | Tran et al. |
| 2009/0237218 | A1* | 9/2009 | Kim .................. G06K 19/0723 340/10.3 |
| 2010/0091921 | A1 | 4/2010 | Besten et al. |
| 2010/0266080 | A1 | 10/2010 | Akita et al. |
| 2014/0240011 | A1* | 8/2014 | Hoeppner ................. H03L 7/08 327/147 |
| 2016/0006559 | A1 | 1/2016 | Arai |

FOREIGN PATENT DOCUMENTS

| | | |
|---|---|---|
| EP | 2211524 A1 | 7/2010 |
| JP | 10-145436 A | 5/1998 |
| JP | 2001-358688 A | 12/2001 |
| JP | 2010-522454 A | 7/2010 |
| KR | 10-2011-0081053 A | 7/2011 |
| WO | 2008/114205 A2 | 9/2008 |
| WO | 2010/053021 A1 | 5/2010 |
| WO | 2014/178314 A1 | 11/2014 |

* cited by examiner

[ FIG. 1 ]
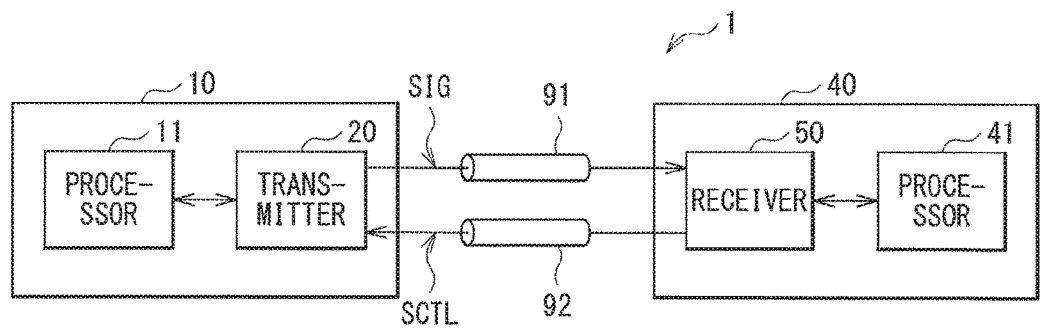
[ FIG. 2 ]
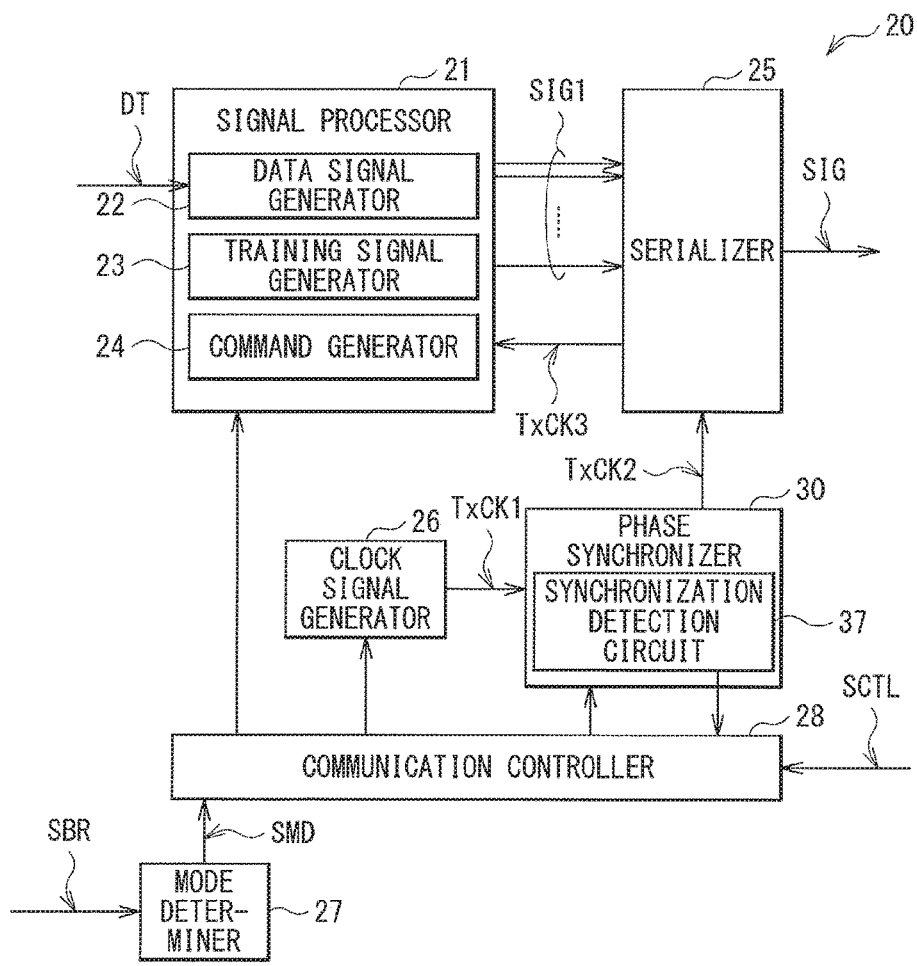

[ FIG. 3 ]
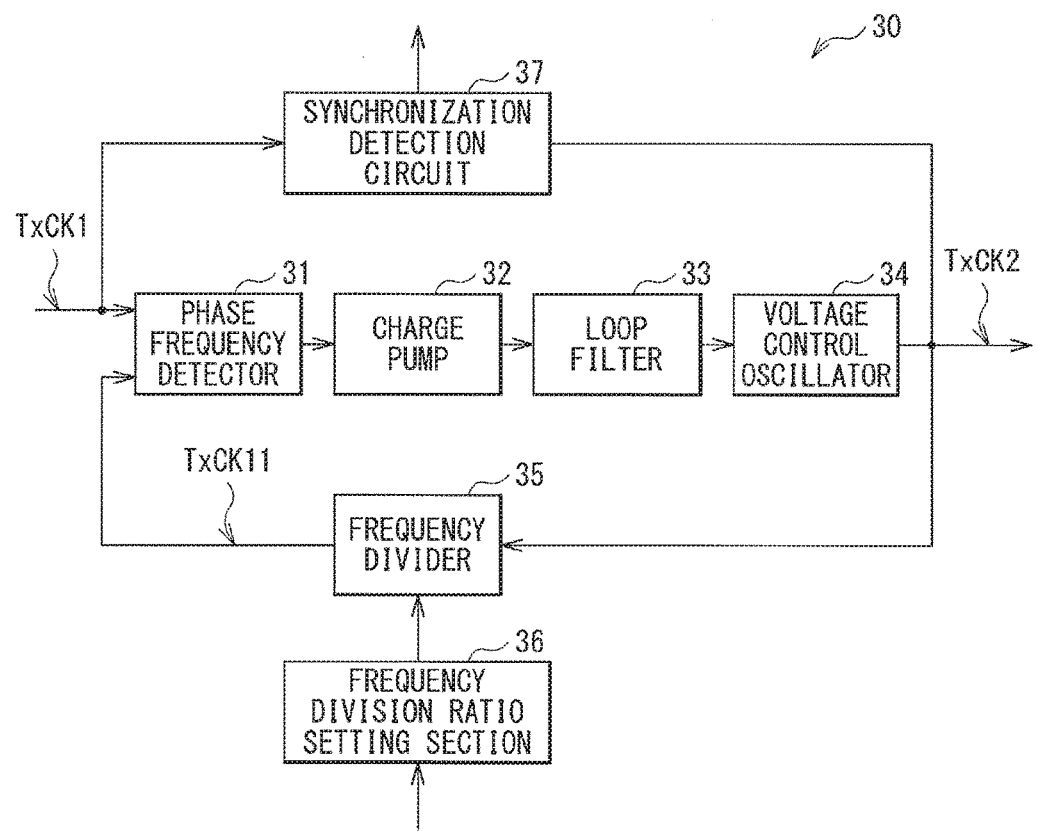

[FIG. 4]
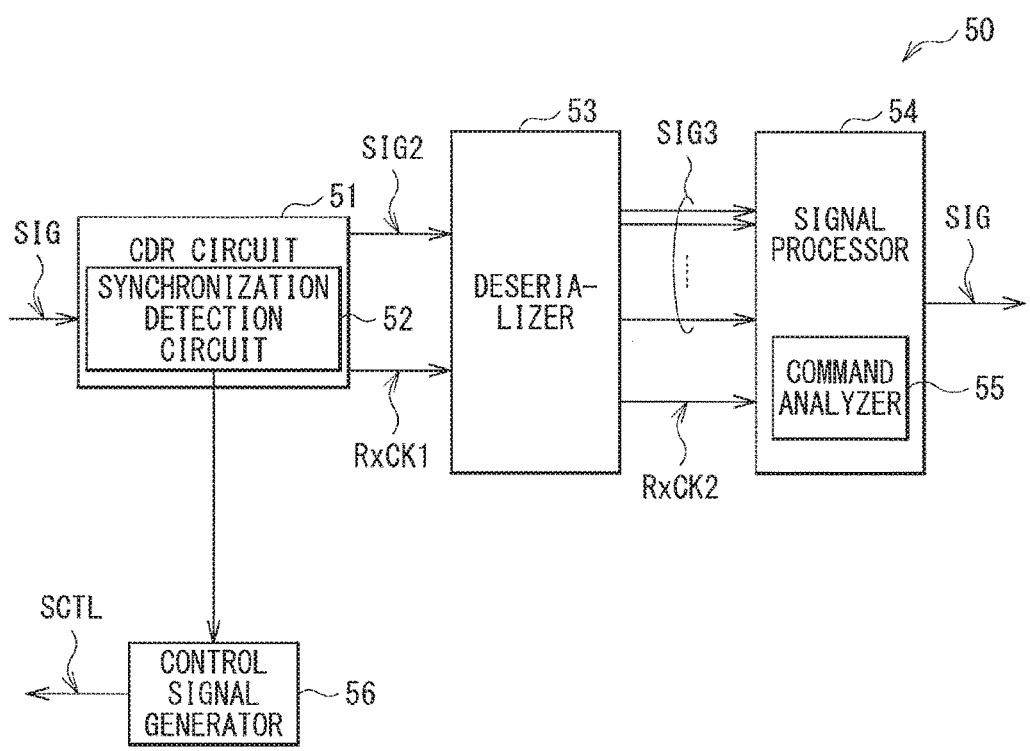

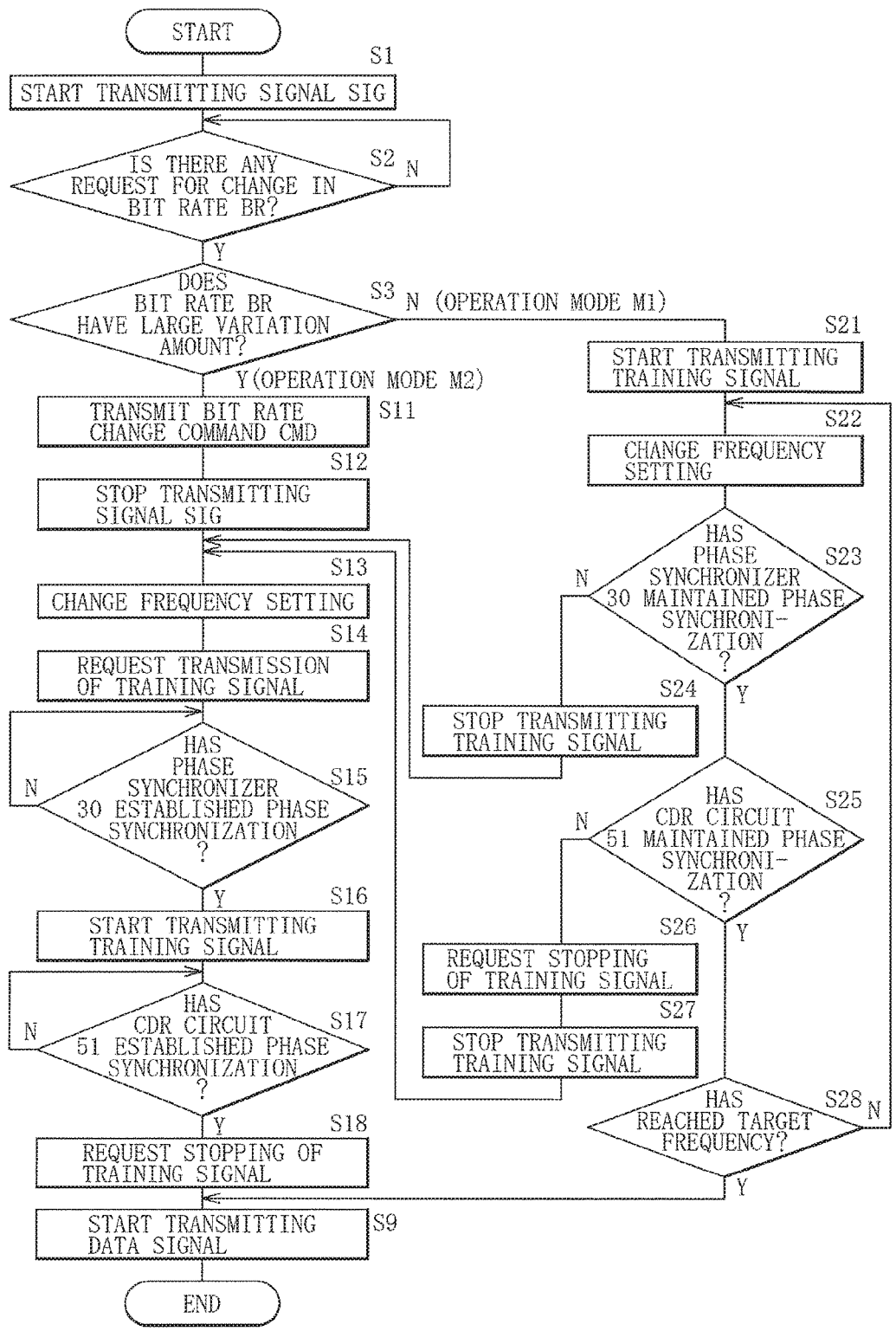
[FIG. 5]

[ FIG. 6 ]
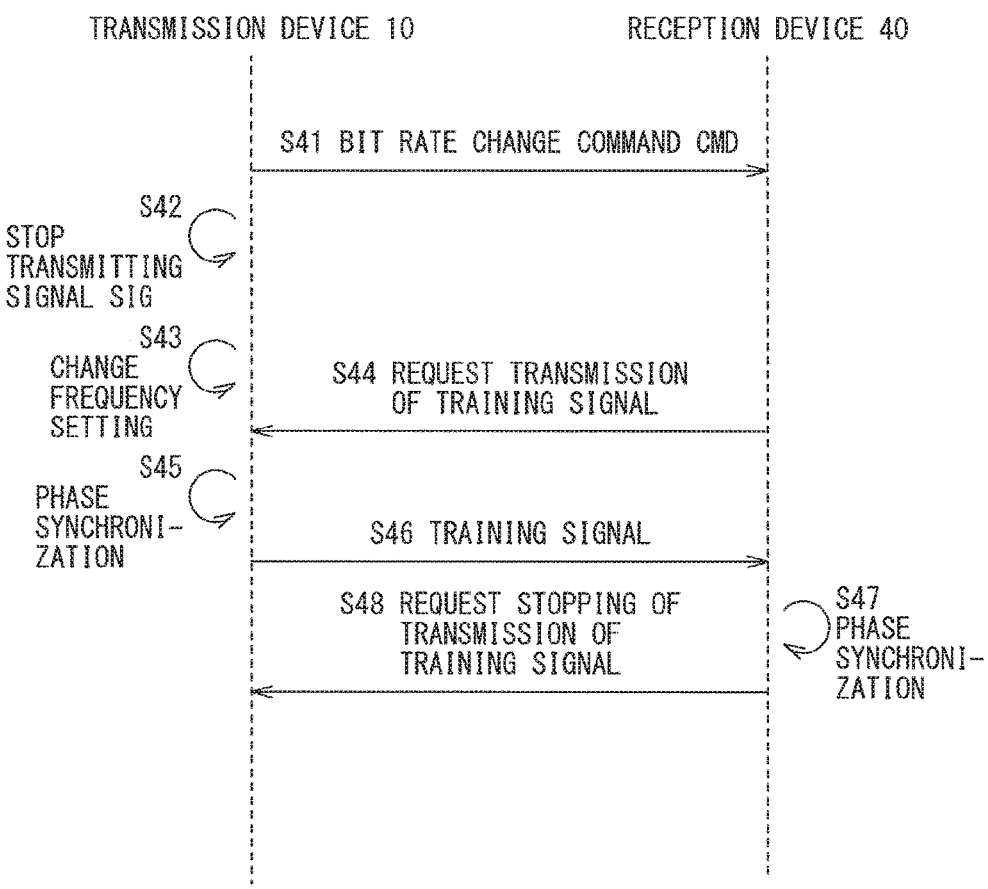

[ FIG. 7A ]
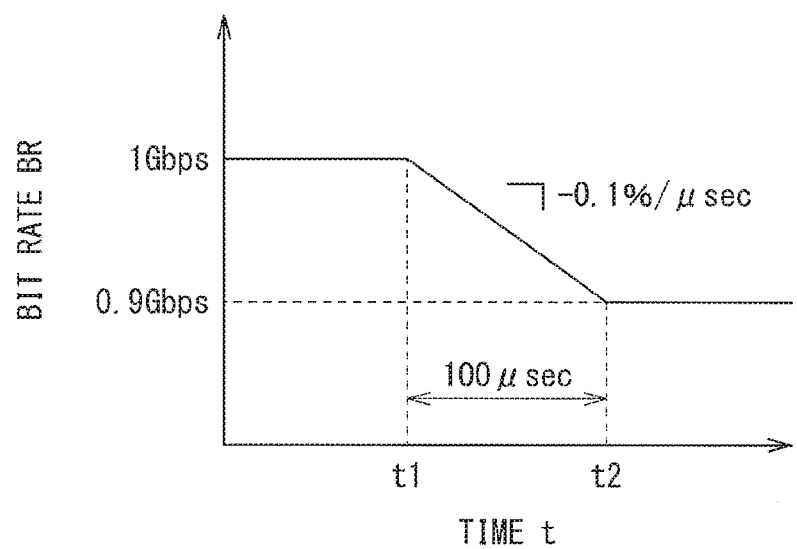
[ FIG. 7B ]
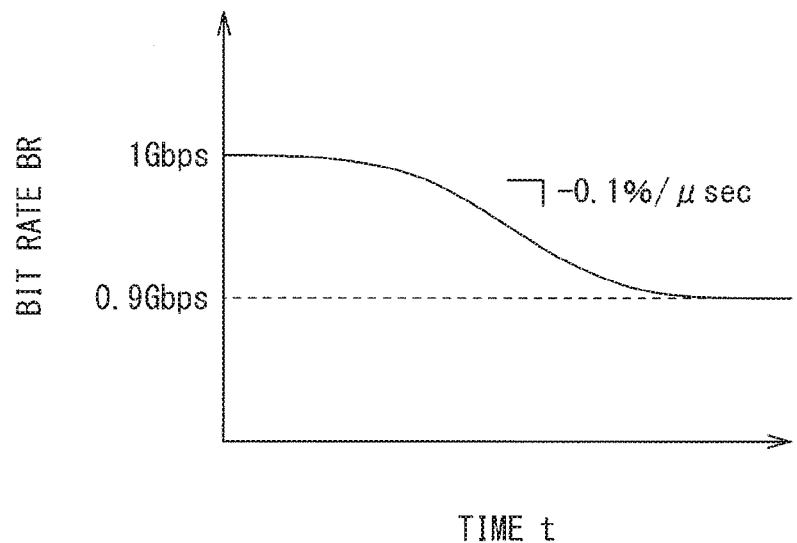

[ FIG. 8 ]
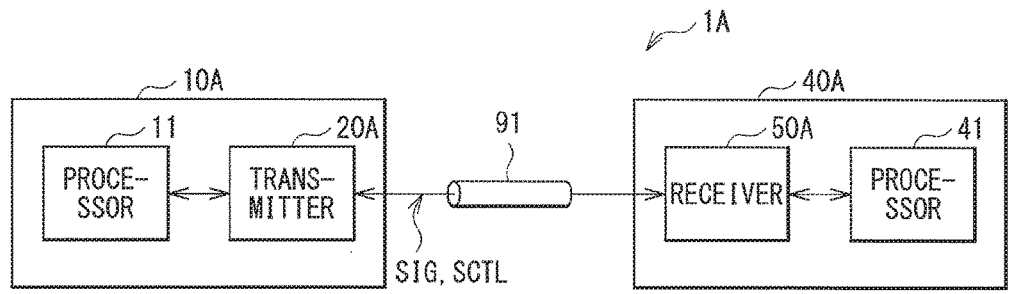
[ FIG. 9 ]
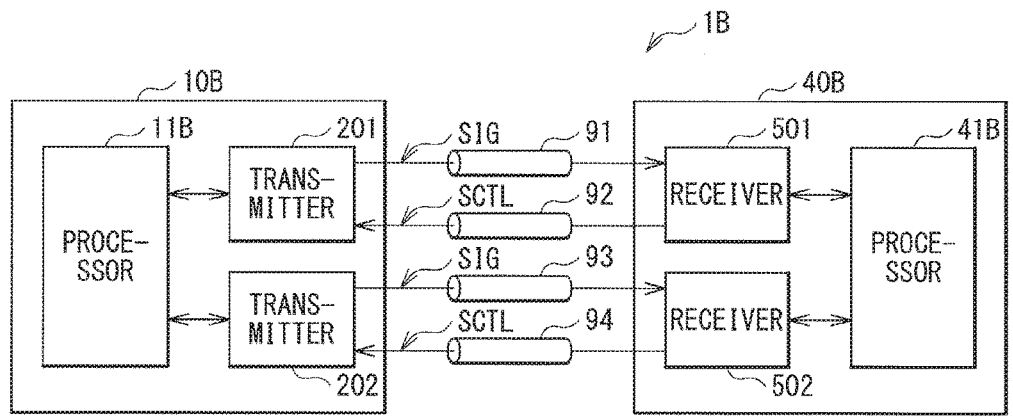
[ FIG. 10 ]
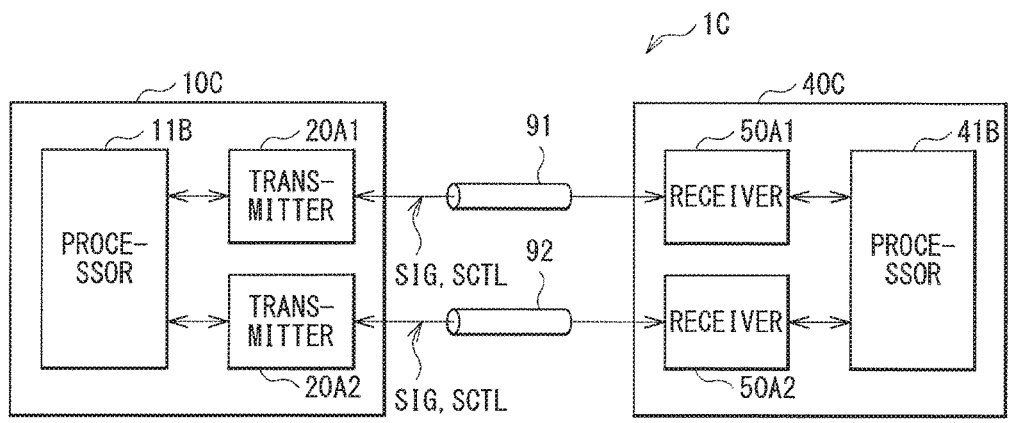

[ FIG. 11 ]
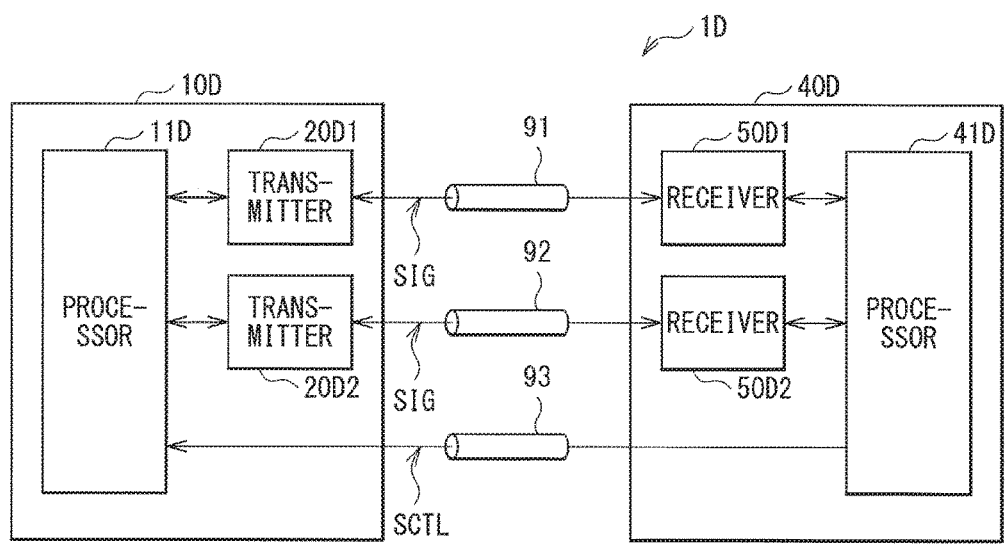

COMMUNICATION SYSTEM AND TRANSMISSION DEVICE

CROSS REFERENCE TO RELATED APPLICATIONS

This application is a U.S. National Phase of International Patent Application No. PCT/JP2017/013925 filed on Apr. 3, 2017, which claims priority benefit of Japanese Patent Application No. JP 2016-098352 filed in the Japan Patent Office on May 17, 2016. Each of the above-referenced applications is hereby incorporated herein by reference in its entirety.

TECHNICAL FIELD

The present disclosure relates to a communication system that transmits and receives a signal, and a transmission device for use in such a communication system.

BACKGROUND ART

In a communication system, for example, there is a case where a signal bit rate is desired to be changed during communication. For example, PTL 1 discloses a communication system in which mutual communication exchange is performed between a transmission device and a reception device to thereby change a signal bit rate.

CITATION LIST

Patent Literature

PTL 1: Japanese Unexamined Patent Application Publication No. H10-145436

SUMMARY OF THE INVENTION

In a case where a signal bit rate is changed during communication as described above, it is desired to change the bit rate in a short period of time.

It is desirable to provide a communication system and a transmission device that make it possible to change a bit rate in a short period of time.

A communication system according to an embodiment of the present disclosure includes a transmission device and a reception device. The transmission device includes a phase synchronizer, a generator, and a controller. The phase synchronizer generates a first clock signal, and is configured to be able to change a frequency of the first clock signal. The generator generates a transmission signal on the basis of the first clock signal. The controller controls the generator and the phase synchronizer to change the frequency of the first clock signal while generating the transmission signal. The reception device receives the transmission signal.

A transmission device according to an embodiment of the present disclosure includes a phase synchronizer, a generator, and a controller. The phase synchronizer generates a first clock signal, and is configured to be able to change a frequency of the first clock signal. The generator generates a transmission signal on the basis of the first clock signal. The controller controls the generator and the phase synchronizer to change the frequency of the first clock signal while generating the transmission signal.

In the communication system and the transmission device according to the embodiments of the present disclosure, the phase synchronizer generates the first clock signal, and the generator generates the transmission signal on the basis of the first clock signal. At that time, the transmission signal is generated, and the frequency of the first clock signal is changed.

According to the communication system and the transmission device of the embodiments of the present disclosure, the frequency of the first clock signal is changed, while the transmission signal is generated, thus making it possible to achieve the communication system that is able to change a bit rate in a short period of time. It is to be noted that the effects described here are not necessarily limitative, and may have any of the effects described in the present disclosure.

BRIEF DESCRIPTION OF DRAWINGS

FIG. 1 is a block diagram illustrating a configuration example of a communication system according to an embodiment of the present disclosure.

FIG. 2 is a block diagram illustrating a configuration example of a transmitter illustrated in FIG. 1.

FIG. 3 is a block diagram illustrating a configuration example of a phase synchronizer illustrated in FIG. 2.

FIG. 4 is a block diagram illustrating a configuration example of a receiver illustrated in FIG. 1.

FIG. 5 is a flowchart illustrating an operation example of the communication system illustrated in FIG. 1.

FIG. 6 is a sequence diagram illustrating an operation example of the communication system illustrated in FIG. 1.

FIG. 7A is an explanatory diagram illustrating an operation example of the communication system illustrated in FIG. 1.

FIG. 7B is an explanatory diagram illustrating another operation example of the communication system illustrated in FIG. 1.

FIG. 8 is a block diagram illustrating a configuration example of a communication system according to a modification example.

FIG. 9 is a block diagram illustrating a configuration example of a communication system according to another modification example.

FIG. 10 is a block diagram illustrating a configuration example of a communication system according to another modification example.

FIG. 11 is a block diagram illustrating a configuration example of a communication system according to another modification example.

MODES FOR CARRYING OUT THE INVENTION

Hereinafter, some embodiments of the present disclosure are described in detail with reference to drawings.

Embodiment

Configuration Example

FIG. 1 illustrates a configuration example of a communication system (a communication system 1) according to an embodiment. The communication system 1 is configured to be able to change a bit rate of a signal SIG to be transmitted. The communication system 1 includes a transmission device 10 and a reception device 40. The transmission device 10 transmits the signal SIG to the reception device 40 via a transmission path 91. A bit rate BR of the signal SIG, in this example, is configured to be settable in a range from 100 Mbps to 1 Gbps, for example. The signal SIG may be a single-ended signal, or a differential signal including two signals that are inverted from each other. Further, the reception device 40 transmits a control signal SCTL to the transmission device 10 via a transmission path 92. The control signal may be a single-ended signal, or a differential signal including two signals that are inverted from each other.

(Transmission Device 10)

The transmission device 10 includes a processor 11 and a transmitter 20. The processor 11 performs predetermined processing to thereby generate data DT to be transmitted. Further, the processor 11 has functions of determining the bit rate BR of the signal SIG to be transmitted in the communication system 1 and also notifying the transmitter 20 of the determined bit rate BR using a bit rate instruction signal SBR. The transmitter 20 receives the control signal SCTL transmitted from the reception device 40, and transmits the signal SIG at the bit rate BR corresponding to the bit rate instruction signal SBR.

FIG. 2 illustrates a configuration example of the transmitter 20. The transmitter 20 includes a signal processor 21, a serializer 25, a clock signal generator 26, a phase synchronizer 30, a mode determiner 27, and a communication controller 28.

The signal processor 21 generates the signal SIG1 that constitutes parallel data on the basis of the data DT supplied from the processor 11, a control signal supplied from the communication controller 28, and a clock signal TxCK3. The signal processor 21 includes a data signal generator 22, a training signal generator 23, and a command generator 24.

The data signal generator 22 performs predetermined processing such as encoding processing on the data DT supplied from the processor 11 on the basis of the control signal supplied from the communication controller 28 to thereby generate a data signal. The signal processor 21 outputs the data signal as the signal SIG1.

On the basis of the control signal supplied from the communication controller 28, the training signal generator 23 generates a training signal upon changing the bit rate BR. Further, the signal processor 21 outputs the training signal as the signal SIG1. The training signal has a signal pattern in which "1" and "0" alternate as in " . . . 1010 . . . " when being serialized by the serializer 25 described later.

The command generator 24 generates a bit rate change command CMD on the basis of the control signal supplied from the communication controller 28. Specifically, the command generator 24 generates the bit rate change command CMD in a case where the bit rate BR has a large variation amount upon changing the bit rate BR. Further, on the basis of the bit rate change command CMD, the signal processor 21 generates the signal SIG1 including the bit rate change command CMD.

On the basis of the signal SIG1 that constitutes the parallel data and on the basis of a clock signal TxCK2, the serializer 25 serializes the signal SIG1 to thereby generate the signal SIG that constitutes serial data. Further, the serializer 25 transmits the signal SIG to the reception device 40. Furthermore, the serializer 25 has functions of performing frequency division of the clock signal TxCK2 at a predetermined frequency division ratio and also outputting, as the clock signal TxCK3, the clock signal having been subjected to the frequency division.

The clock signal generator 26 generates a clock signal TxCK1 having a frequency of about 10 MHz to about 100 MHz, for example The clock signal generator 26 is configured by a phase locked loop (PLL), for example, and is configured to be able to change a frequency of the clock signal TxCK1 on the basis of the control signal supplied from the communication controller 28.

The phase synchronizer 30 generates the clock signal TxCK2 on the basis of the clock signal TxCK1. The phase synchronizer 30 in this example is configured by a so-called fractional N-type PLL.

FIG. 3 illustrates a configuration example of the phase synchronizer 30. The phase synchronizer 30 includes a phase frequency detector (PFD) 31, a charge pump 32, a loop filter 33, a voltage control oscillator 34, a frequency divider 35, a frequency division ratio setting section 36, and a synchronization detection circuit 37.

The phase frequency detector 31 compares a phase of the clock signal TxCK1 and a phase of a clock signal TxCK11 outputted from the frequency divider 35 with each other. On the basis of a phase comparison result in the phase frequency detector 31, the charge pump 32 selectively flows a current to the loop filter 33 or sinks a current from the loop filter 33. The loop filter 33 determines loop response characteristics in the phase synchronizer 30. The voltage control oscillator 34 oscillates at a frequency corresponding to an output voltage of the loop filter 33 to thereby generate the clock signal TxCK2. The frequency divider 35 performs frequency division of the clock signal TxCK2 at a frequency division ratio DR to thereby generate the clock signal TxCK11. The frequency division ratio setting section 36 sets the frequency division ratio DR in the frequency divider 35 on the basis of the control signal supplied from the communication controller 28. The frequency division ratio setting section 36 is able to set the frequency division ratio DR equivalently to a non-integer using delta sigma ($\Delta\Sigma$) modulation, for example. The synchronization detection circuit 37 detects whether or not the phase synchronizer 30 has established phase synchronization on the basis of the clock signals TxCK1 and TxCK2, and notifies the communication controller 28 of a result of the detection. It is to be noted that, in this example, the synchronization detection circuit 37 detects whether or not phase synchronization has been established on the basis of the clock signals TxCK1 and TxCK2; however, this is not limitative. For example, detection of whether or not the phase synchronization has been established may be performed on the basis of the clock signals TxCK1 and TxCK11. Alternatively, the detection of whether or not the phase synchronization has been established may be performed on the basis of the phase comparison result in the phase frequency detector 31.

This configuration allows the transmitter 20 to change the frequency of the clock signal TxCK1 and the frequency division ratio DR in the phase synchronizer 30 to thereby enable a frequency of the clock signal TxCK2 to be set in a range from 100 MHz to 1 GHz, for example. This enables the transmitter 20 to set the bit rate of the signal SIG to be in a range from 100 Mbps to 1 Gbps in this example.

The mode determiner 27 determines an operation of changing the bit rate BR on the basis of the bit rate instruction signal SBR. Upon changing the bit rate BR, the transmitter 20 uses one of two operation modes M1 and M2 in accordance with the variation amount of the bit rate BR. The operation mode M1 is to be used in a case where the bit rate BR has a small variation amount, and the operation mode M2 is to be used in a case where the bit rate BR has a large variation amount. The mode determiner 27 confirms whether or not the variation amount of the bit rate BR is smaller than a predetermined amount on the basis of the bit rate instruction signal SBR. Specifically, for example, the mode determiner 27 confirms whether or not a difference between a current bit rate BR and a changed bit rate BR is smaller than, for example, 20 percent of the current bit rate BR. In a case where the variation amount of the bit rate BR is smaller than the predetermined amount, the mode determiner 27 determines that the operation mode M1 should be used. In a case where the variation amount of the bit rate BR is larger than the predetermined amount, the mode determiner 27 determines that the operation mode M2 should be used. Further, the mode determiner 27 notifies the communication controller 28 of a result of the determination together with information on the changed bit rate BR using a mode signal SMD.

On the basis of the mode signal SMD supplied from the mode determiner 27, the detection result notified of by the synchronization detection circuit 37, and the control signal SCTL supplied from the reception device 40, the communication controller 28 supplies the control signal to each of the signal processor 21, the clock signal generator 26, and the phase synchronizer 30 to thereby control an operation of the transmitter 20.

(Reception Device 40)

The reception device 40 includes a receiver 50 and a processor 41. The receiver 50 receives the signal SIG transmitted from the transmission device 10, and transmits the control signal SCTL to the transmission device 10. The processor 41 performs predetermined processing on the basis of data received by the receiver 50.

FIG. 4 illustrates a configuration example of the receiver 50. The receiver 50 includes a clock and data recovery (CDR) circuit 51, a deserializer 53, a signal processor 54, and a control signal generator 56.

The CDR circuit 51 generates a clock signal RxCK1 and a signal SIG2 on the basis of the signal SIG. The CDR circuit 51 is configured by the PLL, for example. The CDR circuit 51 includes a synchronization detection circuit 52. The synchronization detection circuit 52 detects whether or not the CDR circuit 51 has established phase synchronization, and notifies the control signal generator 56 of a result of the detection.

On the basis of the signal SIG2 that constitutes serial data and on the basis of the clock signal RxCK1, the deserializer 53 deserializes the signal SIG2 to thereby generate a signal SIG3 that constitutes parallel data. Further, the deserializer 53 has functions of performing frequency division of the clock signal RxCK1 at a predetermined frequency division ratio and also outputting, as the clock signal RxCK2, the clock signal having been subjected to the frequency division.

The signal processor 54 performs predetermined processing such as decoding processing on the basis of the signal SIG3 and the clock signal RxCK2. The signal processor 54 includes a command analyzer 55. The command analyzer 55 analyzes whether or not the signal SIG received by the receiver 50 includes the bit rate change command CMD. Further, the signal processor 54 supplies a result of the processing to the processor 41.

The control signal generator 56 generates the control signal SCTL on the basis of the detection result notified of by the synchronization detection circuit 52. Further, the control signal generator 56 transmits the control signal SCTL to the transmission device 10.

Here, the clock signal generator 26 and the phase synchronizer 30 correspond to a specific example of a "phase synchronizer" in the present disclosure. The signal processor 21 and the serializer 25 correspond to a specific example of a "generator" in the present disclosure. The mode determiner 27 and the communication controller 28 correspond to a specific example of a "controller" in the present disclosure.

The operation mode M1 corresponds to a specific example of a "first frequency-changing mode" in the present disclosure. The operation mode M2 corresponds to a specific example of a "second frequency-changing mode" in the present disclosure. The CDR circuit 51 corresponds to a specific example of a "clock recovery section" in the present disclosure.

[Operations and Workings]

Description is given next of operations and workings of the communication system 1 of the present embodiment.

(Outline of Overall Operations)

Description is given first of an outline of overall operations of the communication system 1 with reference to FIGS. 1, 2, and 4. In the transmission device 10 (FIG. 1), the processor 11 performs the predetermined processing to thereby generate the data DT to be transmitted. Further, the processor 11 determines the bit rate BR of the signal SIG, and notifies the transmitter 20 of the determined bit rate BR using the bit rate instruction signal SBR. In the transmitter 20 (FIG. 20), the signal processor 21 generates the signal SIG1 that constitutes the parallel data on the basis of the data DT supplied from the processor 11, the control signal supplied from the communication controller 28, and the clock signal TxCK3. On the basis of the control signal supplied from the communication controller 28, the data signal generator 22 of the transmitter 20 performs the predetermined processing such as the encoding processing on the data DT to thereby generate the data signal. The training signal generator 23 of the transmitter 20 generates the training signal on the basis of the control signal supplied from the communication controller 28. The command generator 24 of the transmitter 20 generates the bit rate change command CMD on the basis of the control signal supplied from the communication controller 28. On the basis of the signal SIG1 that constitutes the parallel data and on the basis of the clock signal TxCK2, the serializer 25 serializes the signal SIG1 to thereby generate the signal SIG that constitutes the serial data. Further, the serializer 25 performs frequency division of the clock signal TxCK2 at a predetermined frequency division ratio, and outputs, as the clock signal TxCK3, the clock signal having been subjected to the frequency division. The clock signal generator 26 generates the clock signal TxCK1. The phase synchronizer 30 generates the clock signal TxCK2 on the basis of the clock signal TxCK1. The synchronization detection circuit 37 of the phase synchronizer 30 detects whether or not the phase synchronizer 30 has established phase synchronization, and notifies the communication controller 28 of the detection result. The mode determiner 27 determines which one of the operation modes M1 and M2 should be used upon changing the bit rate BR on the basis of the bit rate instruction signal SBR, and notifies the communication controller 28 of the determination result together with the information on the changed bit rate BR using the mode signal SMD. On the basis of the mode signal SMD supplied from the mode determiner 27, the detection result notified of by the synchronization detection circuit 37, and the control signal SCTL supplied from the reception device 40, the communication controller 28 supplies the control signal to each of the signal processor 21, the clock signal generator 26, and the phase synchronizer 30 to thereby control the operations of the transmitter 20.

In the receiver 50 (FIG. 4) of the reception device 40, the CDR circuit 51 generates the clock signal RxCK1 and the signal SIG2 on the basis of the signal SIG. The synchronization detection circuit 52 of the CDR circuit 51 detects whether or not the CDR circuit 51 has established phase synchronization, and notifies the control signal generator 56 of the detection result. On the basis of the signal SIG2 that constitutes the serial data and on the basis of the clock signal RxCK1, the deserializer 53 deserializes the signal SIG2 to thereby generate the signal SIG3 that constitutes the parallel data. Further, the deserializer 53 performs frequency division of the clock signal RxCK1 at a predetermined frequency division ratio, and outputs, as the clock signal RxCK2, the clock signal having been subjected to the frequency division. The signal processor 54 performs the predetermined processing such as the decoding processing on the basis of the signal SIG3 and the clock signal RxCK2. The command analyzer 55 of the signal processor 54 analyzes whether or not the signal SIG received by the receiver 50 includes the bit rate change command CMD. The control signal generator 56 generates the control signal SCTL on the basis of the detection result notified of by the synchronization detection circuit 52. The processor 41 (FIG. 1) performs the predetermined processing on the basis of the data received by the receiver 50.

(Detailed Operation)

FIG. 5 illustrates an example of an operation of changing the bit rate BR in the communication system 1. In a case of transmitting the signal SIG, the communication system 1 determines which one of the operation modes M1 and M2 should be used on the basis of the bit rate instruction signal SBR, and changes the bit rate BR of the signal SIG on the basis of a result of the determination. Description is given below in detail of this operation.

First, the transmission device 10 starts transmitting the signal SIG (step S1). Specifically, the clock signal generator 26 first generates the clock signal TxCK1 having a certain frequency on the basis of the control signal supplied from the communication controller 28. Further, the phase synchronizer 30 sets the frequency division ratio DR on the basis of the control signal supplied from the communication controller 28, and generates the clock signal TxCK2 on the basis of the clock signal TxCK1. The data signal generator 22 of the signal processor 21 performs the predetermined processing such as the encoding processing on the data DT supplied from the processor 11 on the basis of the control signal supplied from the communication controller 28 to thereby generate the data signal. Further, on the basis of this data signal, the signal processor 21 generates the signal SIG1. The serializer 25 serializes the signal SIG1 to thereby generate the signal SIG, and transmits the signal SIG to the reception device 40.

The CDR circuit 51 of the reception device 40 receives the signal SIG, and generates the signal SIG2 and the clock signal RxCK1 on the basis of the signal SIG. On the basis of the signal SIG2 that is serial and on the basis of the clock signal RxCK1, the deserializer 53 deserializes the signal SIG2 to thereby generate the signal SIG3 that constitutes the parallel data. The signal processor 54 performs the predetermined processing such as the decoding processing on the basis of the signal SIG3 and the clock signal RxCK2.

Next, the mode determiner 27 of the transmission device 10 confirms whether or not there is any request for change in the bit rate BR (step S2). Specifically, the mode determiner 27 confirms whether or not the bit rate instruction signal SBR is supplied from the processor 11. In a case where there is no request for change in the bit rate BR, the flow repeats step S2. Further, in a case where there is a request for change in the bit rate BR, the flow proceeds to step S3.

Next, the mode determiner 27 confirms whether or not the bit rate BR has a large variation amount (step S3). Specifically, the mode determiner 27 confirms whether or not the variation amount of the bit rate BR is smaller than the predetermined amount on the basis of the bit rate instruction signal SBR. For example, the mode determiner 27 confirms whether or not the difference between the current bit rate BR and the changed bit rate BR is larger than, for example, 20 percent of the current bit rate BR. In a case where the variation amount of the bit rate BR is larger than the predetermined amount ("Y" in step S3), the mode determiner 27 determines that the operation mode M2 should be used, and notifies the communication controller 28 of the determination result together with the information on the bit rate BR using the mode signal SMD. Thereafter, the flow proceeds to step S11. Further, in a case where the variation amount of the bit rate BR is smaller than the predetermined amount ("N" in step S3), the mode determiner 27 determines that the operation mode M1 should be used, and notifies the communication controller 28 of the determination result together with the information on the bit rate BR using the mode signal SMD. Thereafter, the flow proceeds to step S21.

(Operation Mode M2)

Description is given first of a case where the operation mode M2 is used to vary the bit rate BR (steps S11 to S18).

FIG. 6 illustrates an operation of the communication system 1 in the operation mode M2. In FIG. 6, steps S41 to S48 correspond, respectively, to steps S11 to S18 in FIG. 5.

As illustrated in FIGS. 5 and 6, in a case of operation in the operation mode M2, the transmission device 10 first transmits the bit rate change command CMD (steps S11 and S41). Specifically, the command generator 24 of the signal processor 21 first generates the bit rate change command CMD on the basis of the control signal supplied from the communication controller 28. Further, the signal processor 21 generates the signal SIG1 including the bit rate change command CMD. The serializer 25 serializes the signal SIG1 to thereby generate the signal SIG, and transmits the signal SIG to the reception device 40.

The reception device 40 receives the signal SIG including the bit rate change command CMD. Further, the command analyzer 55 confirms that the signal SIG received by the receiver 50 includes the bit rate change command CMD.

Next, the transmission device 10 stops transmitting the signal SIG (steps S12 and S42). Specifically, the signal processor 21 stops the processing on the basis of the control signal supplied from the communication controller 28. This causes the transmission device 10 to stop transmitting the signal SIG. As a result, the CDR circuit 51 of the reception device 40 is temporarily out of phase synchronization.

Next, the transmission device 10 changes a frequency setting (steps S13 and S43). Specifically, the clock signal generator 26 first changes the frequency of the clock signal TxCK1 on the basis of the control signal supplied from the communication controller 28. Further, the phase synchronizer 30 changes the frequency division ratio DR on the basis of the control signal supplied from the communication controller 28. This causes the phase synchronizer 30 to be temporarily out of phase synchronization. Thereafter, the phase synchronizer 30 starts an operation toward establishment of the phase synchronization.

It is to be noted, although the frequency of the clock signal TxCK1 is changed and also the frequency division ratio DR is changed in this example, this is not limitative. Alternatively, the frequency division ratio DR may be changed without changing the frequency of the clock signal TxCK1; the frequency of the clock signal TxCK1 may be changed without changing the frequency division ratio DR. In other words, it is possible for the transmission device 10 to determine how to set the frequency of the clock signal TxCK1 and the frequency division ratio DR, depending on a changed frequency.

Next, the reception device 40 requests transmission of the training signal (steps S14 and S44). That is, in steps S12 and S42, the CDR circuit 51 of the reception device 40 is temporarily out of phase synchronization, and thus the synchronization detection circuit 52 of the reception device 40 detects that the CDR circuit 51 has not established the phase synchronization. Thereafter, on the basis of a result of the detection, the control signal generator 56 generates the control signal SCTL indicating the request for the transmission of the training signal, and transmits the control signal SCTL to the transmission device 10. The communication controller 28 of the transmission device 10 receives the control signal SCTL.

Next, the phase synchronizer 30 of the transmission device 10 establishes the phase synchronization (step S45). Specifically, the synchronization detection circuit 37 of the transmission device 10 first confirms whether or not the phase synchronizer 30 has established the phase synchronization (step S15). In a case where the phase synchronization has not yet been established ("N" in step S15), the flow returns to step S15, and repeats the process until the phase synchronization is established.

Next, the transmission device 10 starts transmitting the signal SIG (training signal) (steps S16 and S46). Specifically, the transmission device 10 has already received the request for the transmission of the training signal in steps S14 and S44, and thus the training signal generator 23 of the signal processor 21 generates the training signal on the basis of the control signal supplied from the communication controller 28. Thereafter, the serializer 25 serializes the signal SIG1 (training signal) to thereby generate the signal SIG, and transmits the signal SIG to the reception device 40.

The reception device 40 receives the signal SIG. Thereafter, on the basis of the signal SIG (training signal), the CDR circuit 51 of the reception device 40 starts an operation toward establishment of the phase synchronization. That is, in steps S12 and S42, the CDR circuit 51 of the reception device 40 is temporarily out of phase synchronization, and thus the CDR circuit 51 starts an operation toward establishment of the phase synchronization on the basis of the signal SIG (training signal).

Next, the CDR circuit 51 of the reception device 40 establishes the phase synchronization (step S47). Specifically, the synchronization detection circuit 52 of the reception device 40 first confirms whether or not the CDR circuit 51 has established the phase synchronization (step S17). In a case where the phase synchronization has not yet been established ("N" in step S17), the flow returns to step S17, and repeats the process until the phase synchronization is established.

Next, the reception device 40 requests stopping of the transmission of the training signal (steps S18 and S48). Specifically, on the basis of the detection result in the synchronization detection circuit 52, the control signal generator 56 generates the control signal SCTL indicating the request for stopping the transmission of the training signal, and transmits the control signal SCTL to the transmission device 10.

Thereafter, the flow proceeds to step S9.

(Operation Mode M1)

Description is given next of a case of using the operation mode M1 to vary the bit rate BR (steps S21 to S28).

The transmission device 10 first starts transmitting the training signal (step S21). Specifically, the training signal generator 23 of the signal processor 21 generates the training signal on the basis of the control signal supplied from the communication controller 28. Thereafter, the serializer 25 serializes the signal SIG1 (training signal) to thereby generate the signal SIG, and transmits the signal SIG to the reception device 40. The CDR circuit 51 of the reception device 40 continues to maintain the phase synchronization.

Next, the transmission device 10 changes the frequency setting (step S22). Specifically, the phase synchronizer 30 first changes the frequency division ratio DR on the basis of the control signal supplied from the communication controller 28. In this situation, the communication controller 28 changes the frequency division ratio DR within such a range as to enable the phase synchronizer 30 and the CDR circuit 51 to maintain the phase synchronization.

Next, the synchronization detection circuit 37 of the transmission device 10 confirms whether or not the phase synchronizer 30 has maintained the phase synchronization (step S23).

In a case where the phase synchronization has not been maintained in step S23 ("N" in step S23), the transmission device 10 stops transmitting the training signal (step S24). Specifically, the training signal generator 23 of the signal processor 21 stops the processing on the basis of the control signal supplied from the communication controller 28. This causes the transmission device 10 to stop transmitting the signal SIG. As a result, the CDR circuit 51 of the reception device 40 is temporarily out of phase synchronization. Thereafter, the flow proceeds to step S13.

In a case where the phase synchronization has been maintained in step S23 ("Y" in step S23), the synchronization detection circuit 52 of the reception device 40 confirms whether or not the CDR circuit 51 has maintained the phase synchronization (step S25).

In a case where the phase synchronization has not been maintained in step S25 ("N" in step S25), the reception device 40 requests stopping of the transmission of the training signal (step S26). Specifically, on the basis of the detection result in the synchronization detection circuit 52, the control signal generator 56 generates the control signal SCTL indicating the request for stopping the transmission of the training signal, and transmits the control signal SCTL to the transmission device 10. This causes the transmission device 10 to stop transmitting the training signal (step S27). As a result, the CDR circuit 51 of the reception device 40 is temporarily out of phase synchronization. Thereafter, the flow proceeds to step S13.

In a case where the phase synchronization has been maintained in step S25 ("Y" in step S25), the transmission device 10 confirms whether or not the frequency of the clock signal TxCK2 has reached a target frequency (step S28). Specifically, on the basis of a frequency setting in the clock signal generator 26 and a setting of the frequency division ratio DR in the phase synchronizer 30, the communication controller 28 determines the frequency of the clock signal TxCK2, and confirms whether or not the determined frequency has reached a frequency (target frequency) corresponding to the changed bit rate BR included in the mode signal SMD. In a case where the target frequency has not yet been reached, the flow returns to step S22, and these operations are repeated until the target frequency is reached. In this manner, the communication controller 28 gradually changes the frequency division ratio DR at a plurality of separate times to thereby gradually change the frequency of the clock signal TxCK2.

FIGS. 7A and 7B each illustrate an example of a case where the bit rate BR is varied from 1 Gbps to 0.9 Gbps using the operation mode M1. In the example of FIG. 7A, the bit rate BR is varied linearly at a variation rate of −0.1%/μsec. Further, in the example of FIG. 7B, the bit rate BR is varied smoothly. In this example, a magnitude of the variation rate is set to 0.1%/μsec. or less. That is, the variation rate is set to enable the phase synchronizer 30 and the CDR circuit 51 to maintain the phase synchronization. Accordingly, the variation rate is not limited to this value, but is set depending on performances of the phase synchronizer 30 and the CDR circuit 51.

In a case where the frequency of the clock signal TxCK2 has reached the target frequency in step S28, the flow proceeds to step S9.

Thereafter, the transmission device 10 starts transmitting the data signal (step S9). Specifically, the training signal generator 23 of the signal processor 21 first stops the processing on the basis of the control signal supplied from the communication controller 28. Thereafter, on the basis of the control signal supplied from the communication controller 28, the data signal generator 22 of the signal processor 21 performs the predetermined processing such as the encoding processing on the data DT supplied from the processor 11 to thereby generate the data signal. Thereafter, the signal processor 21 generates the signal SIG1 on the basis of the data signal. The serializer 25 serializes the signal SIG1 to thereby generate the signal SIG, and transmits the signal SIG to the reception device 40. The reception device 40 receives the signal SIG.

In a manner as described above, the flow ends.

In this manner, the two operation modes M1 and M2 are provided in the communication system 1 upon changing the bit rate BR in a case where the signal SIG is transmitted, thus making it possible to shorten time it takes to change the bit rate BR. That is, for example, in the operation mode M2, the transmission of the signal SIG is stopped temporarily, frequency settings of the clock signal generator 26 and the phase synchronizer 30 are changed, and the phase synchronizer 30 has established the phase synchronization. In this situation, it takes a time period of, for example, 500 μsec. for the phase synchronizer 30 to establish the phase synchronization. After the phase synchronizer 30 has established the phase synchronization, the transmission device 10 transmits the signal SIG (training signal). At this time, in a case where the transmission device 10 and the reception device 40 are AC-coupled to each other, it takes a time period of, for example, 50 μsec. to charge a capacitor to be used for the AC-coupling. Thereafter, the CDR circuit 51 establishes the phase synchronization on the basis of the training signal. In this situation, it takes a time period of, for example, 50 μsec. for the CDR circuit 51 to establish the phase synchronization. After the CDR circuit 51 has established the phase synchronization, the transmission device 10 starts transmitting the signal SIG (data signal). Accordingly, in a case where the operation mode M2 is used to change the bit rate BR in this manner, it takes a time period of about 600 μsec. Meanwhile, for example, in a case where the bit rate BR is changed from 1 Gbps to 0.9 Gbps, for example, a time period of about 100 μsec. to about 200 μsec. suffices with use of the operation mode M1, as illustrated in FIGS. 7A and 7B. In the communication system 1, it is determined which one of the two operation modes M1 and M2 should be used on the basis of the variation amount of the bit rate BR. This makes it possible, for example, to use the operation mode M1 in a case where the bit rate BR has a small variation amount and to use the operation mode M2 in a case where the bit rate BR has a large variation amount. This makes it possible to shorten a time period it takes to change the bit rate BR, for example, in the case where the bit rate BR has a small variation amount.

Further, in the communication system 1, suppose that the phase synchronization is not able to be maintained in the phase synchronizer 30 or in the CDR circuit 51, in a case where the operation mode M1 is used to change the bit rate BR, modes are switched from the operation mode M1 to the operation mode M2 during communication. This makes it possible to reduce the possibility that a time period it takes to change the bit rate BR may be lengthened even in a case where the phase synchronizer 30 or the CDR circuit 51 is out of phase synchronization due to an unexpected reason.

Further, in the communication system 1, the phase synchronizer 30 is configured by the so-called fractional N-type PLL, thus making it possible to vary the frequency of the clock signal TxCK2 more smoothly owing to high degree of freedom in setting the frequency division ratio DR, for example, in a case of using the operation mode M1 to change the bit rate BR. In this case, the bit rate BR of the signal SIG also varies smoothly, thus making it easier for the CDR circuit 51 to maintain the phase synchronization.

Further, in the communication system 1, the transmission device 10 transmits the training signal having the alternating pattern such as " . . . 1010 . . . " upon changing the bit rate BR. This makes it possible to increase transition frequency in the signal SIG, thus making it easier for the CDR circuit 51 to perform the phase synchronization. Furthermore, such a training signal is less likely to generate so-called inter symbol interference (ISI) jitter, thus making it possible to reduce the possibility that a reception error may occur in the reception device 40. Moreover, in a case where the reception device 40 receives such a training signal, parallel data outputted from the deserializer 53 are fixed. Hence, it becomes possible for the reception device 40 to suppress data transition, thus making it possible to reduce electric power consumption.

Further, in the communication system 1, the transmission device 10 transmits the bit rate change command CMD in a case where the bit rate BR has a large variation amount. This makes it possible for the reception device 40 to grasp that the bit rate BR is to be varied significantly afterward. Thus, it becomes possible for the reception device 40 to perform various types of processing prepared for variation in the bit rate BR, for example. Specifically, for example, temporarily widening a loop band of the CDR circuit 51 makes it easier to establish the phase synchronization. Enabling various types of processing to be performed in this manner makes it possible to enhance degree of freedom in operations.

[Effects]

As described above, in the present embodiment, provision of the two operation modes makes it possible to shorten a time period it takes to change the bit rate.

In the present embodiment, in a case where the operation mode M1 is used to change the bit rate, when it is not possible to maintain the phase synchronization, modes are switched from the operation mode M1 to the operation mode M2 during the communication, thus making it possible to reduce the possibility that a time period it takes to change the bit rate may be lengthened even in a case of out of phase synchronization due to an unexpected reason.

In the present embodiment, the phase synchronizer is configured by the fractional N-type PLL, thus making it easier for the CDR circuit to maintain the phase synchronization in the operation mode M1.

In the present embodiment, the transmission device transmits the training signal having the alternating pattern upon changing the bit rate, thus making it easier for the CDR circuit to perform the phase synchronization, reducing the possibility that a reception error may occur, and thus reducing electric power consumption in the reception device.

In the present embodiment, the transmission device transmits the bit rate change command in a case where the bit rate has a large variation amount, thus making it possible for the reception device to grasp that the bit rate is to be varied significantly afterward. This makes it possible to perform various types of processing prepared for variation in the bit rate, for example, thus making it possible to enhance degree of freedom in operations.

Modification Example 1

In the present embodiment, the training signal has such an alternating pattern as " . . . 1010 . . . "; however, this is not limitative. Alternatively, for example, the training signal may have such a repeating pattern as " . . . 11001100 . . . ", or may have such a repeating pattern as " . . . 1111000011110000 . . . ". In this case as well, it is possible for the reception device 40 to suppress data transition, thus making it possible to reduce electric power consumption.

Further, for example, the training signal may have a predetermined repeating pattern closer to actual data. Specifically, it is possible to use, for example, a training pattern in universal serial bus (USB) 3.0, or a pseudo random bit sequence (PRBS) pattern. It is also possible to use a pattern that is encoded from these patterns using 8B10B or 64B66B. As the PRBS pattern, for example, patterns such as PRBS7, PRBS9, PRBS11, and PRBS31 may be used. In a case of using a pattern closer to actual data in this manner, the reception device 40 may be provided with, for example, an equalizer that compensates loss of a high-frequency component in the transmission path 91 in order to optimize a coefficient of the equalizer using the training signal.

Modification Example 2

In the foregoing embodiment, the command generator 24 generates the bit rate change command CMD in a case where the bit rate BR has a large variation amount; however, this is not limitative. Alternatively, for example, the command generator 24 may generate the bit rate change command CMD also in a case where the bit rate BR has a small variation amount, in addition to the case where the bit rate BR has a large variation amount. In other words, the command generator 24 may generate the bit rate change command CMD regardless of the variation amount of the bit rate BR in a case of changing the bit rate BR.

Modification Example 3

In the foregoing embodiment, the command generator 24 is provided; however, this is not limitative. Alternatively, for example, the command generator 24 may be omitted. In this case, for example, it is desirable that the signal processor 54 of the reception device 40 detect the training signal, and that the reception device 40 grasp, on the basis of a result of the detection, that the bit rate BR is changed.

Modification Example 4

In the foregoing embodiment, the transmission device 10 varies the bit rate BR while transmitting the training signal in the operation mode M1; however, this is not limitative. Alternatively, for example, the transmission device 10 may vary the bit rate BR while transmitting the data signal generated by the data signal generator 22.

Modification Example 5

In the foregoing embodiment, the signal SIG is transmitted via the transmission path 91, and the control signal SCTL is transmitted via the transmission path 92; however, this is not limitative. Alternatively, for example, the signal SIG and the control signal SCTL may be transmitted via one transmission path 91, as in a communication system 1A illustrated in FIG. 8. The communication system 1A includes a transmission device 10A and a reception device 40A. The transmission device 10A includes a transmitter 20A. The reception device 40A includes a receiver 50A. The transmitter 20A transmits the signal SIG to the receiver 50A via the transmission path 91. The receiver 50A transmits the control signal SCTL to the transmitter 20A via the transmission path 91.

Modification Example 6

In the foregoing embodiment, the transmission device 10 includes one transmitter 20, and the reception device 40 includes one receiver 50; however, this is not limitative. Alternatively, for example, the transmission device may include a plurality of transmitters 20, and the reception device may include a plurality of receivers 50, as in a communication system 1B illustrated in FIG. 9. The communication system 1B includes a transmission device 10B and a reception device 40B. The transmission device 10B includes a processor 11B and transmitters 201 and 202. The transmitters 201 and 202 each have a configuration similar to that of the transmitter 20 according to the foregoing embodiment. The reception device 40B includes receivers 501 and 502 and a processor 41B. The receivers 501 and 502 each have a configuration similar to that of the receiver 50 according to the foregoing embodiment. The transmitter 201 transmits the signal SIG to the receiver 501 via the transmission path 91, and the receiver 501 transmits the control signal SCTL to the transmitter 201 via the transmission path 92. The transmitter 202 transmits the signal SIG to the receiver 502 via a transmission path 93, and the receiver 502 transmits the control signal SCTL to the transmitter 202 via a transmission path 94.

Further, the present modification example may be applied to the communication system 1A according to Modification Example 5. Specifically, for example, the transmission device may include a plurality of transmitters 20A, and the reception device may include two receivers 50A, as in a communication system 1C illustrated in FIG. 10. The communication system 1C includes a transmission device 10C and a reception device 40C. The transmission device 10C includes the processor 11B and transmitters 20A1 and 20A2. The transmitters 20A1 and 20A2 each have a configuration similar to that of the transmitter 20A according to the communication system 1A (FIG. 8). The reception device 40C includes receivers 50A1 and 50A2 and the processor 41B. The receivers 50A1 and 50A2 each have a configuration similar to that of the receiver 50A according to the communication system 1A (FIG. 8). The transmitter 20A1 transmits the signal SIG to the receiver 50A1 via the transmission path 91, and the receiver 50A1 transmits the control signal SCTL to the transmitter 20A1 via the transmission path 91. The transmitter 20A2 transmits the signal SIG to the receiver 50A2 via the transmission path 92, and the receiver 50A2 transmits the control signal SCTL to the transmitter 20A2 via the transmission path 92.

Further, the reception device may transmit the control signal SCTL to the transmission device via one transmission path, as in a communication system 1D illustrated in FIG. 11. The communication system 1D includes a transmission device 10D and a reception device 40D. The transmission device 10D includes a processor 11D and transmitters 20D1 and 20D2. The reception device 40D includes receivers 50D1 and 50D2 and a processor 41D. The transmitter 20D1 transmits the signal SIG to the receiver 50D1 via the transmission path 91. The transmitter 20D2 transmits the signal SIG to the receiver 50D2 via the transmission path 92. The processor 41D of the reception device 40D transmits the control signal SCTL to the processor 11D of the transmission device 10D via the transmission path 93.

Other Modification Examples

Moreover, two or more of the modification examples may be combined.

Although the present technology has been described above referring to the embodiment and some modification examples, the present technology is not limited to these embodiments, etc., and may be modified in a variety of ways.

For example, in the foregoing embodiment, etc., the phase synchronizer 30 is configured by the fractional N-type PLL; however, this is not limitative. Alternatively, for example, the phase synchronizer 30 may be configured by a PLL in which the frequency division ratio DR is settable to various integers.

It is to be noted that effects described herein are merely illustrative and are not limitative, and may have other effects.

It is to be noted that the present technology may have the following configurations.

(1)

A communication system including:
a transmission device that includes
a phase synchronizer that generates a first clock signal, and is configured to be able to change a frequency of the first clock signal,
a generator that generates a transmission signal on the basis of the first clock signal, and
a controller that controls the generator and the phase synchronizer to change the frequency of the first clock signal while generating the transmission signal; and
a reception device that receives the transmission signal.

(2)

The communication system according to (1), in which the controller gradually changes a frequency setting of the phase synchronizer to thereby vary the frequency of the first clock signal while maintaining phase synchronization of the phase synchronizer.

(3)

The communication system according to (2), in which the controller has a first frequency-changing mode and a second frequency-changing mode,
the controller varies the frequency of the first clock signal while generating the transmission signal in the first frequency-changing mode, and
the controller varies the frequency of the first clock signal while stopping the generation of the transmission signal in the second frequency-changing mode.

(4)

The communication system according to (3), in which the controller changes the frequency setting once to thereby vary the frequency of the first clock signal in the second frequency-changing mode.

(5)

The communication system according to (3) or (4), in which the controller selects one of the first frequency-changing mode and the second frequency-changing mode on the basis of a frequency variation amount upon varying the frequency of the first clock signal.

(6)

The communication system according to (5), in which
the controller selects the first frequency-changing mode in a case where the frequency variation amount is smaller than a predetermined amount, and
the controller selects the second frequency-changing mode in a case where the frequency variation amount is larger than the predetermined amount.

(7)

The communication system according to any one of (3) to (6), in which, in the first frequency-changing mode, the controller switches modes from the first frequency-changing mode to the second frequency-changing mode in a case where the phase synchronizer is out of phase synchronization.

(8)

The communication system according to any one of (3) to (7), in which the reception device includes a clock generator that generates a second clock signal on the basis of the transmission signal.

(9)

The communication system according to (8), in which the reception device generates a control signal and transmits the generated control signal to the transmission device in a case where a phase of the transmission signal and a phase of the second clock signal are out of phase synchronization from each other in the clock generator.

(10)

The communication system according to (9), in which, in the first frequency-changing mode, the controller switches modes from the first frequency-changing mode to the second frequency-changing mode on the basis of the control signal.

(11)

The communication system according to any one of (3) to (10), in which, in the first frequency-changing mode, the generator generates, as the transmission signal, a signal having a repeating pattern.

(12)

The communication system according to any one of (2) to (11), in which
the phase synchronizer includes
a clock generator that generates a third clock signal,
a frequency divider that performs frequency division of the first clock signal to thereby generate a fourth clock signal,
a phase comparator that compares a phase of the third clock signal and a phase of the fourth clock signal with each other, and
an oscillator that generates the first clock signal on the basis of a result of the phase comparison performed by the phase comparator, and
the frequency setting includes one or both of a setting of a frequency of the third clock signal and a setting of a frequency division ratio in the frequency divider.

(13)

The communication system according to any one of (1) to (12), in which the phase synchronizer includes a fractional N-type phase synchronous circuit.

(14)

A transmission device including:

a phase synchronizer that generates a first clock signal, and is configured to be able to change a frequency of the first clock signal;

a generator that generates a transmission signal on the basis of the first clock signal; and a controller that controls the generator and the phase synchronizer to change the frequency of the first clock signal while generating the transmission signal.

This application claims the benefit of Japanese Priority Patent Application JP2016-098352 filed with the Japan Patent Office on May 17, 2016, the entire contents of which are incorporated herein by reference.

It should be understood by those skilled in the art that various modifications, combinations, sub-combinations, and alterations may occur in accordance with design requirements and other factors insofar as they are within the scope of the appended claims or the equivalents thereof.

The invention claimed is:

1. A communication system comprising:
a transmission device that includes
a phase synchronizer configured to generate a first clock signal, and is configured to be able to change a frequency of the first clock signal,
a generator configured to generate a transmission signal on a basis of the first clock signal, and
a controller configured to control the generator and the phase synchronizer to change the frequency of the first clock signal while generating the transmission signal; and
a reception device configured to receive the transmission signal.

2. The communication system according to claim 1, wherein the controller if further configured to gradually change a frequency setting of the phase synchronizer to thereby vary the frequency of the first clock signal while maintaining phase synchronization of the phase synchronizer.

3. The communication system according to claim 2, wherein
the controller has a first frequency-changing mode and a second frequency-changing mode,
the controller is further configured to vary the frequency of the first clock signal while generating the transmission signal in the first frequency-changing mode, and
the controller if further configured to vary the frequency of the first clock signal while stopping the generation of the transmission signal in the second frequency-changing mode.

4. The communication system according to claim 3, wherein the controller is further configured to change the frequency setting once to thereby vary the frequency of the first clock signal in the second frequency-changing mode.

5. The communication system according to claim 3, wherein the controller is further configured to select one of the first frequency-changing mode and the second frequency-changing mode on a basis of a frequency variation amount upon varying the frequency of the first clock signal.

6. The communication system according to claim 5, wherein
the controller is further configured to select the first frequency-changing mode in a case where the frequency variation amount is smaller than a predetermined amount, and
the controller is further configured to select the second frequency-changing mode in a case where the frequency variation amount is larger than the predetermined amount.

7. The communication system according to claim 3, wherein, in the first frequency-changing mode, the controller is further configured to switch modes from the first frequency-changing mode to the second frequency-changing mode in a case where the phase synchronizer is out of the phase synchronization.

8. The communication system according to claim 3, wherein the reception device includes a clock recovery section configured to recover a second clock signal on a basis of the transmission signal.

9. The communication system according to claim 8, wherein the reception device is further configured to generate a control signal and transmit the generated control signal to the transmission device in a case where a phase of the transmission signal and a phase of the second clock signal are out of phase synchronization from each other in the clock recovery section.

10. The communication system according to claim 9, wherein, in the first frequency-changing mode, the controller is further configured to switch modes from the first frequency-changing mode to the second frequency-changing mode on a basis of the control signal.

11. The communication system according to claim 3, wherein, in the first frequency-changing mode, the generator is further configured to generate, as the transmission signal, a signal having a repeating pattern.

12. The communication system according to claim 2, wherein
the phase synchronizer includes
a clock generator configured to generate a third clock signal,
a frequency divider configured to perform frequency division of the first clock signal to thereby generate a fourth clock signal,
a phase comparator configured to compare a phase of the third clock signal and a phase of the fourth clock signal with each other, and
an oscillator configured to generate the first clock signal on a basis of a result of the phase comparison performed by the phase comparator, and
the frequency setting includes one or both of a setting of a frequency of the third clock signal and a setting of a frequency division ratio in the frequency divider.

13. The communication system according to claim 1, wherein the phase synchronizer includes a fractional N-type phase synchronous circuit.

14. A transmission device comprising:
a phase synchronizer configured to generate a clock signal, and is configured to be able to change a frequency of the clock signal;
a generator configured to generate a transmission signal on a basis of the first clock signal; and
a controller configured to control the generator and the phase synchronizer to change the frequency of the clock signal while generating the transmission signal.

* * * * *